United States Patent
Higaki et al.

(10) Patent No.: US 10,607,842 B2
(45) Date of Patent: Mar. 31, 2020

(54) ELECTROLYTIC PLATING APPARATUS

(71) Applicant: EBARA CORPORATION, Tokyo (JP)

(72) Inventors: Takehiko Higaki, Tokyo (JP); Jumpei Fujikata, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 126 days.

(21) Appl. No.: 15/836,116

(22) Filed: Dec. 8, 2017

(65) Prior Publication Data

US 2018/0166286 A1 Jun. 14, 2018

(30) Foreign Application Priority Data

Dec. 14, 2016 (JP) ................................. 2016-242365

(51) Int. Cl.
*H01L 21/288* (2006.01)
*C25D 17/00* (2006.01)
*C25D 5/08* (2006.01)
*C25D 21/00* (2006.01)

(52) U.S. Cl.
CPC ............ *H01L 21/2885* (2013.01); *C25D 5/08* (2013.01); *C25D 17/001* (2013.01); *C25D 17/007* (2013.01); *C25D 17/008* (2013.01); *C25D 21/00* (2013.01)

(58) Field of Classification Search
CPC . H01M 21/2885; C25D 21/00; C25D 17/001; C25D 17/008; C25D 17/007; C25D 5/08
See application file for complete search history.

(56) References Cited

U.S. PATENT DOCUMENTS

| | | | |
|---|---|---|---|
| 6,278,210 B1* | 8/2001 | Fatula, Jr. ............... | H01F 38/18 310/112 |
| 2003/0075451 A1* | 4/2003 | Kanda ...................... | C25D 7/12 205/157 |
| 2006/0163076 A1* | 7/2006 | Chang ..................... | C25D 5/18 205/157 |
| 2015/0191845 A1* | 7/2015 | Scherson ............... | C25D 17/10 417/48 |
| 2018/0087174 A1* | 3/2018 | Cheong .................. | C25D 5/022 |

FOREIGN PATENT DOCUMENTS

JP 2015-193935 A 11/2015

OTHER PUBLICATIONS

Wikipedia—Wireless Power Transfer (Year: 2019).*
Agbinya, Johnson I.. Wireless Power Transfer, River Publishers, 2016. ProQuest Ebook Central, https://ebookcentral.proquest.com/lib/uspto-ebooks/detail.action?docID=4509482. (Year: 2016).*

* cited by examiner

*Primary Examiner* — Louis J Rufo
(74) *Attorney, Agent, or Firm* — BakerHostetler

(57) ABSTRACT

An electrolytic plating apparatus capable of establishing electric connection between a power supply and a substrate without physical contact is disclosed. The electrolytic plating apparatus includes: a plating tank configured to hold a plating solution therein; an anode disposed in the plating tank; a substrate holder having an electric contact arranged to be able to contact a substrate; a power supply coupled to the anode; a wireless electric-power transmitter coupled to the power supply; and a wireless electric-power receiver mounted to the substrate holder and electrically connected to the electric contact.

8 Claims, 17 Drawing Sheets

ELECTROLYTIC PLATING APPARATUS

CROSS REFERENCE TO RELATED APPLICATION

This document claims priority to Japanese Patent Application Number 2016-242365 filed Dec. 14, 2016, the entire contents of which are hereby incorporated by reference.

BACKGROUND

In the manufacture of semiconductor devices, an electrolytic plating apparatus is used to deposit a metal (e.g., copper) on a substrate, such as a wafer. Generally, the electrolytic plating apparatus is configured to plate a substrate by immersing a substrate holder that is holding the substrate, to be plated, in a plating solution held in a plating tank and applying a voltage between an anode and the substrate. A feeding terminal is connected to a wire that is connected to a negative pole of a power supply, and the substrate holder has an external electric contact that is to be electrically connected to the feeding terminal. The substrate holder further has an internal electric contact which is to be held in contact with a conductive layer (e.g., a seed layer) of the substrate.

When the substrate is held by the substrate holder, the internal electric contact is brought into contact with the conductive layer of the substrate, so that the substrate is electrically connected to the substrate holder. Further, when the substrate holder is placed on the plating tank, the external electric contact of the substrate holder is brought into contact with the feeding terminal, so that the substrate holder is electrically connected to the negative pole of the power supply. The substrate is electrically connected to the negative pole of the power supply through the substrate holder, and therefore the power supply can apply a voltage between the anode and the substrate.

Each of the above-discussed electric contacts is formed by a thin metal plate and is of a rectangular shape for easy contact with the feeding terminal or the substrate. Therefore, when an excessive force is exerted on the electric contact, it may be deformed or may be, in some cases, broken. Moreover, repetitive use of the substrate holder may cause the electric contacts to be broken due to fatigue. Furthermore, the electric contacts are expensive because the metal plates of the electric contacts are plated with gold for increased electric conductivity.

SUMMARY OF THE INVENTION

According to an embodiment, there is provided an electrolytic plating apparatus which is capable of establishing electric connection between a power supply and a substrate without physical contact.

Embodiments, which will be described below, relate to an electrolytic plating apparatus for plating a substrate, such as a wafer, by applying a voltage between the substrate and an anode.

In an embodiment, there is provided an electrolytic plating apparatus comprising: a plating tank configured to hold a plating solution therein; an anode disposed in the plating tank; a substrate holder having an electric contact arranged to be able to contact a substrate; a power supply coupled to the anode; a wireless electric-power transmitter coupled to the power supply; and a wireless electric-power receiver mounted to the substrate holder and electrically connected to the electric contact.

In an embodiment, the wireless electric-power transmitter is disposed outside the plating tank.

In an embodiment, the wireless electric-power transmitter comprises an electric-power transmitting coil, and the electric-power transmitting coil is disposed in the plating tank.

In an embodiment, the substrate holder has a recess defined therein, and the electric-power transmitting coil is located in the recess.

In an embodiment, the substrate holder includes a first holding member and a second holding member for sandwiching the substrate therebetween, the second holding member has an opening through which a surface, to be plated, of the substrate can be exposed, and the wireless electric-power receiver is disposed in the second holding member.

In an embodiment, the wireless electric-power transmitter includes at least one electric-power transmitting coil, and the wireless electric-power receiver includes at least one electric-power receiving coil.

In an embodiment, the wireless electric-power transmitter includes a plurality of electric-power transmitting coils, and the wireless electric-power receiver includes a plurality of electric-power receiving coils.

In an embodiment, the at least one electric-power transmitting coil and the at least one electric-power receiving coil are disposed in a vertical position.

In an embodiment, the at least one electric-power transmitting coil and the at least one electric-power receiving coil are disposed in a horizontal position.

In an embodiment, there is provided an electrolytic plating apparatus comprising: a plating tank configured to hold a plating solution therein; an anode disposed in the plating tank; a substrate holder disposed in the plating tank; a metal plate disposed outside the plating tank; and a power supply coupled to the anode and the metal plate.

In an embodiment, there is provided an electrolytic plating apparatus comprising: a plating tank configured to hold a plating solution therein; an anode disposed in the plating tank; a substrate holder disposed in the plating tank; a metal plate disposed in the substrate holder; and a power supply coupled to the anode and the metal plate.

In an embodiment, there is provided an electrolytic plating apparatus comprising: a plating tank configured to hold a plating solution therein; an anode disposed in the plating tank; a substrate holder disposed in the plating tank; a DC-RF converter configured to convert a direct-current voltage into a high-frequency voltage, the DC-RF converter being coupled to the anode; a power supply coupled to the DC-RF converter; and a wireless electric-power transmitter coupled to the power supply.

In an embodiment, there is provided an electrolytic plating apparatus comprising: a plating tank configured to hold a plating solution therein; an anode disposed in the plating tank; a substrate holder disposed in the plating tank; a DC-RF converter configured to convert a direct-current voltage into a high-frequency voltage, the DC-RF converter being coupled to the anode; a power supply coupled to the DC-RF converter; and a wireless electric-power transmitter coupled to the power supply, the wireless electric-power transmitter including a plurality of electric-power transmitting coils.

According to the above-described embodiments, the electric connection between the power supply and the substrate is established by the wireless electric-power transmitter at the plating-tank side and the wireless electric-power receiver at the substrate-holder side. As a result, the number of electric contacts can be reduced.

DESCRIPTION OF EMBODIMENTS

Embodiments will be described below with reference to the drawings.

Figure 1:
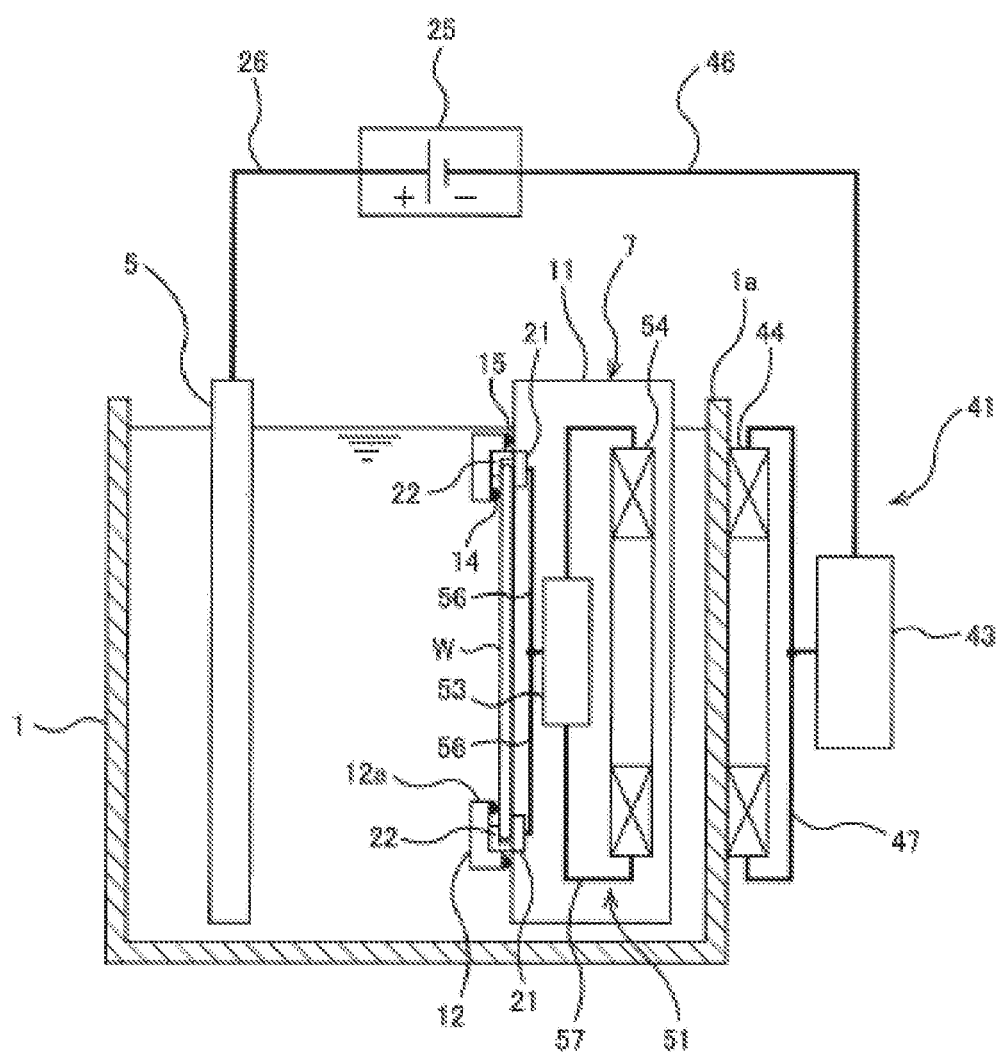
FIG. 1 is a schematic view showing an electrolytic plating apparatus for plating a substrate, such as a wafer, according to an embodiment.

FIG. 1 is a schematic view showing an electrolytic plating apparatus for plating a substrate, such as a wafer, according to an embodiment. As shown in FIG. 1, the electrolytic plating apparatus includes a plating tank 1 capable of holding a plating solution therein, an anode 5 disposed in the plating tank 1, and a substrate holder 7 having electric contacts 21, 22 capable of contacting a substrate W. The plating solution contains metal ions serving as a metal source, and further contains additives, such as a plating accelerator, a plating suppressor, a leveler, etc. In the present embodiment, the anode 5 and the substrate holder 7, which are disposed in the plating tank 1, are in a vertical position. The substrate W that is held by the substrate holder 7 is immersed in the plating solution. In this embodiment, the substrate W is of a circular shape. In one embodiment, the substrate W may be of a square shape.

The substrate W, such as a wafer, is held by the substrate holder 7 with a surface of the substrate W exposed. The substrate holder 7 is transported to the plating tank 1 by a transporter (not shown in the drawings), and is placed in the plating tank 1 such that the substrate holder 7 is in the vertical position, as shown in FIG. 1. The substrate W held by the substrate holder 7 and the anode 5 are opposite to each other in the plating tank 1.

The surface, to be plated, of the substrate W has a conductive layer, such as a seed layer. The substrate holder 7 has a first holding member 11 and a second holding member 12 which can sandwich the substrate W therebetween. The substrate W is supported by the first holding member 11, and is pressed against the first holding member 11 by the second holding member 12. The second holding member 12 has an opening 12a defined therein for exposing the surface, to be plated, of the substrate W therethrough. When the substrate W is held by the first holding member 11 and the second holding member 12, the surface, to be plated, of the substrate W is exposed through the opening 12a. Therefore, the surface, to be plated, of the substrate W is able to contact the plating solution held in the plating tank 1.

The second holding member 12 has a first seal ridge 14 for contacting the edge of the surface, to be plated, of the substrate W and a second seal ridge 15 for contacting the first holding member 11. The first seal ridge 14 and the second seal ridge 15 are of an endless shape. When the substrate W is held by the first holding member 11 and the second holding member 12, the first seal ridge 14 is pressed against the edge of the surface, to be plated, of the substrate W, and the second seal ridge 15 is pressed against the first holding member 11. A gap between the second sealing member 12 and the substrate W is sealed by the first seal ridge 14, and a gap between the first holding member 11 and the second holding member 12 is sealed by the second seal ridge 15. As a result, a hermetic space is formed in the substrate holder 7.

The substrate holder 7 has a plurality of first electric contacts 21 and a plurality of second electric contacts 22, both of which are located in the above-described hermetic space. The first electric contacts 21 and the second electric contacts 22 are arranged at equal intervals along a periphery of the substrate W. The first electric contacts 21 are secured to the first holding member 11, and the second electric contacts 22 are secured to the second holding member 12. When the substrate W is held by the first holding member 11 and the second holding member 12, the second electric contacts 22 are in contact with the first electric contacts 21, respectively, and are also in contact with the surface, to be plated, of the substrate W. As a result, the conductive layer (e.g., a seed layer) of the surface, to be plated, of the substrate W is electrically connected to the first electric contacts 21 and the second electric contacts 22.

The electrolytic plating apparatus further includes a direct-current power supply 25, a wireless electric-power transmitter 41 coupled to the direct-current power supply 25, and a wireless electric-power receiver 51 mounted to the substrate holder 7. The anode 5 is electrically connected to the positive pole of the direct-current power supply 25 by a wire 26, and the wireless electric-power transmitter 41 is electrically connected to the negative pole of the direct-current power supply 25 by a wire 46. The wireless electric-power transmitter 41 and the wireless electric-power receiver 51 constitute a wireless electric power feeding system which can transmit the electric power from the wireless electric-power transmitter 41 to the wireless electric-power receiver 51 in a contactless manner. According to the present embodiment, the wireless electric-power transmitter 41 is mounted to the plating tank 1, while the wireless electric-power receiver 51 is incorporated in the substrate holder 7.

The wireless electric-power transmitter 41 includes a DC-RF driver 43 and an electric-power transmitting coil 44. In this embodiment, the DC-RF driver 43 and the electric-power transmitting coil 44 are disposed outside the plating tank 1. The electric-power transmitting coil 44 is secured to an outer surface of a side wall 1a of the plating tank 1. The DC-RF driver 43 is electrically connected to the negative pole of the direct-current power supply 25 via the wire 46, and also electrically connected to the electric-power transmitting coil 44 by a wire 47. The DC-RF driver 43 is configured to convert a direct-current voltage (or DC voltage) applied from the direct-current power supply 25 into a high-frequency voltage, and apply the high-frequency voltage to the electric-power transmitting coil 44.

The wireless electric-power receiver 51 includes a RF-DC rectifier 53 and an electric-power receiving coil 54. In this embodiment, the RF-DC rectifier 53 and the electric-power receiving coil 54 are disposed in the first holding member 11 of the substrate holder 7. The RF-DC rectifier 53 is electrically connected to the first electric contacts 21 of the substrate holder 7 by wires 56, and also electrically connected to the electric-power receiving coil 54 by a wire 57. The RF-DC rectifier 53 is configured to convert a high-frequency voltage, generated by the electric-power receiving coil 54, into a direct-current voltage, and apply the direct-current voltage to the first electric contacts 21.

Figure 2:
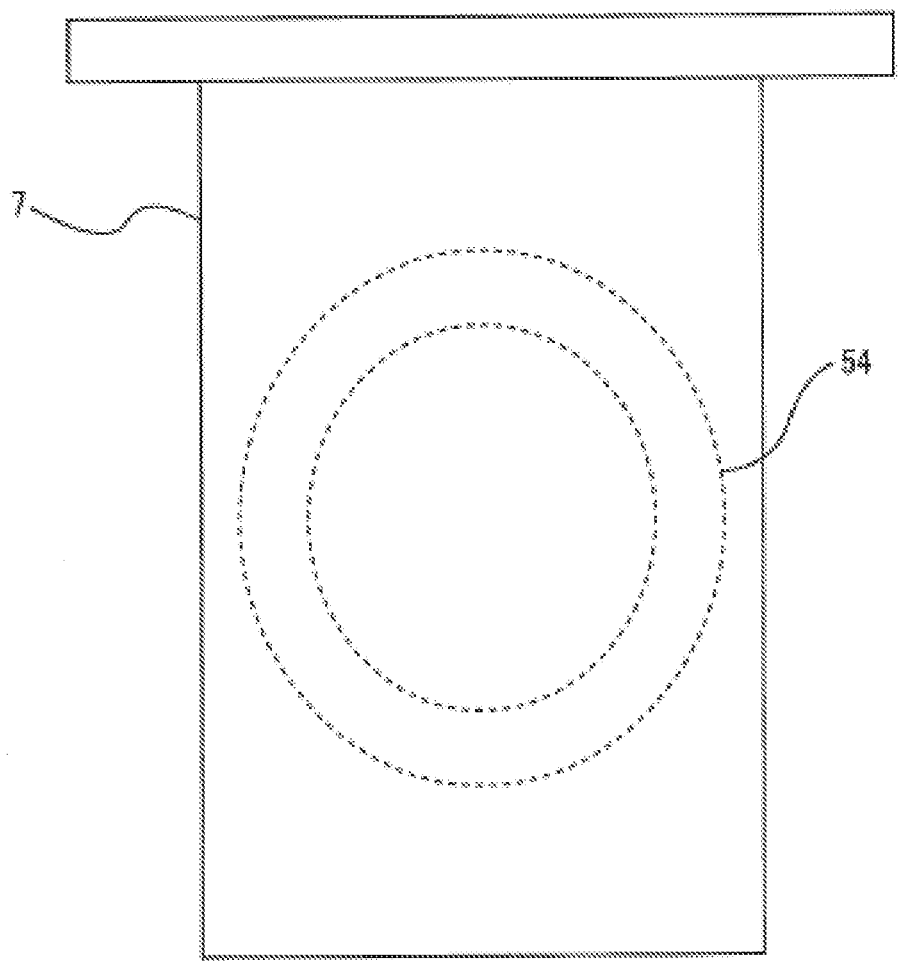
FIG. 2 is a view showing an electric-power receiving coil disposed in a substrate holder.

FIG. 2 is a view showing the electric-power receiving coil 54 disposed in the substrate holder 7. As shown in FIG. 2, the electric-power receiving coil 54 comprises a single annular coil. The electric-power receiving coil 54 may be of another shape. For example, if the substrate W has a square shape, then the electric-power receiving coil 54 may also have a square shape. The electric-power receiving coil 54 is fully covered with the substrate holder 7 so that the plating solution cannot contact the electric-power receiving coil 54. The size of the electric-power receiving coil 54 may be the same as or different from the size of the substrate W. The size of the electric-power transmitting coil 44 may be the same as or different from the size of the electric-power receiving coil 54.

The electric-power transmitting coil 44 and the electric-power receiving coil 54 are opposite to each other with a gap interposed therebetween. The electric-power transmitting coil 44 and the electric-power receiving coil 54 are arranged concentrically. In this embodiment, the electric-power transmitting coil 44 and the electric-power receiving coil 54 are arranged in a vertical position. The electric-power transmitting coil 44 and the electric-power receiving coil 54 are out of physical contact. As described below, when the high-frequency voltage is applied to the electric-power transmitting coil 44, a high-frequency voltage is induced in the electric-power receiving coil 54. A distance between the electric-power transmitting coil 44 disposed outside the plating tank 1 and the electric-power receiving coil 54 disposed inside the plating tank 1 is such that the electric-power receiving coil 54 is capable of generating an effective electric power for plating of the substrate W.

The substrate W is plated as follows. The substrate holder 7 that is holding the substrate W, to be plated, is transported to the plating tank 1 by the transporter (not shown), and is immersed in the plating solution held in the plating tank 1, as shown in FIG. 1. With the anode 5 and the surface, to be plated, of the substrate W being in contact with the plating solution, the direct-current power supply 25 applies a direct-current voltage to the anode 5 and the wireless electric-power transmitter 41. The DC-RF driver 43 converts the direct-current voltage, applied from the direct-current power supply 25, into a high-frequency voltage, and applies the high-frequency voltage to the electric-power transmitting coil 44. An electromagnetic field is formed between the electric-power transmitting coil 44 and the electric-power receiving coil 54, thus inducing a high-frequency voltage in the electric-power receiving coil 54.

The RF-DC rectifier 53 converts the high-frequency voltage generated by the electric-power receiving coil 54 into a direct-current voltage, and applies the direct-current voltage to the first electric contacts 21 of the substrate holder 7. The first electric contacts 21 and the second electric contacts 22 are held in contact with each other, and the second electric contacts 22 are held in contact with the surface, to be plated, of the substrate W. Therefore, the direct-current voltage is applied to the substrate W. The exposed surface of the substrate W that is held by the substrate holder 7 is now plated in the presence of the plating solution. After the plating of the substrate W is terminated, the substrate holder 7 is taken out of the plating tank 1 by the transporter (not shown), and carried to a next process.

A known wireless electric power feeding system may be used as the wireless electric-power transmitter 41 and the wireless electric-power receiver 51. For example, a known wireless electric power feeding system of direct-current resonance type, electromagnetic induction type, magnetic resonance type, microwave (electromagnetic wave) type, or other type may be used. The magnetic resonance type refers to a system wherein both an electric-power transmitting side and an electric-power receiving side employ a resonant circuit, and the electric-power receiving side is resonant with an electromagnetic field generated by the electric-power transmitting side that uses an alternating current. The electric-power transmitting side is thus capable of supplying electric power to the electric-power receiving side which is spaced from the electric-power transmitting side. The wireless electric power feeding system of the direct-current resonance type is a system wherein both an electric-power transmitting side and an electric-power receiving side employ a resonant circuit, and the electric-power receiving side is resonant with an electromagnetic field generated by a direct-current voltage of the electric-power transmitting side, so that the electric-power transmitting side is able to supply electric power to the electric-power receiving side which is spaced from the electric-power transmitting side.

The wireless electric-power transmitter 41 and the wireless electric-power receiver 51 can establish the electric connection between the direct-current power supply 25 and the substrate W without physical contact. According to the present embodiment, therefore, it is possible to dispense with electric contacts between a feeding terminal and the substrate holder 7 which have been necessary heretofore. As a result, even after the substrate holder 7 has been used repeatedly, a desired voltage can be applied to the substrate W.

Figure 3:
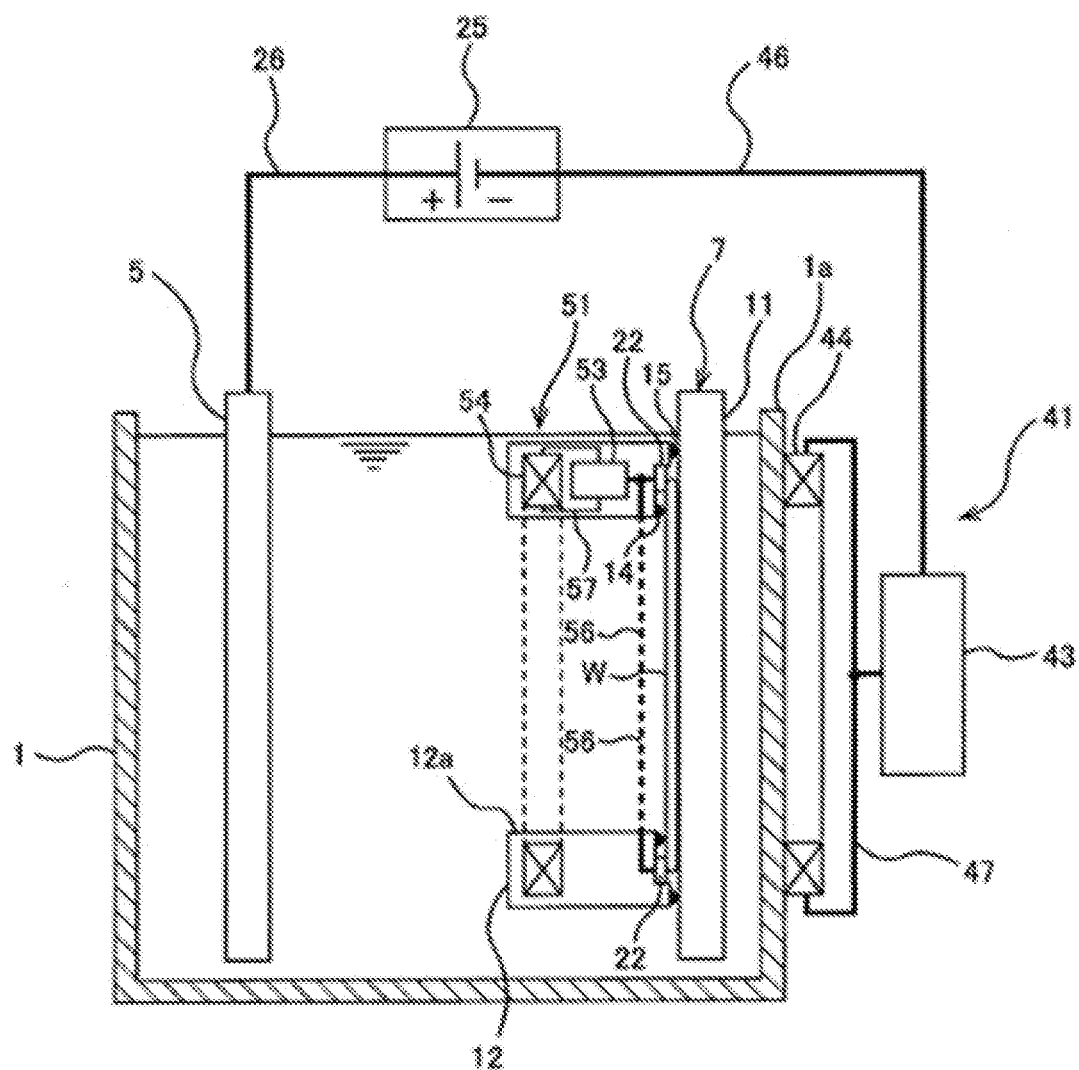
FIG. 3 is a schematic view showing an electrolytic plating apparatus according to an embodiment.

FIG. 3 is a schematic view showing an electrolytic plating apparatus according to an embodiment. Structural and operational details of the present embodiment, which will not be described in particular, are identical to those of the embodiment shown in FIG. 1, and hence their repetitive descriptions will be omitted. As shown in FIG. 3, the wireless electric-power receiver 51 is disposed in the second holding member 12 of the substrate holder 7. More specifically, the RF-DC rectifier 53 and the electric-power receiving coil 54 are disposed in the second holding member 12 of the substrate holder 7.

According to the present embodiment, the above-described first electric contacts 21 for electrically connecting the first holding member 11 and the second holding member 12 of the substrate holder 7 are not necessary. According to the present embodiment, therefore, the second electric contacts 22 will be referred to simply as electric contacts 22. These electric contacts 22 are coupled to the RF-DC rectifier 53 by wires 56. A high-frequency voltage induced in the electric-power receiving coil 54 is converted by the RF-DC rectifier 53 into a direct-current voltage, which is applied to the substrate W through the wires 56 and the electric contacts 22. According to the present embodiment, since the first electric contacts 21 are not necessary, a plating failure caused by a contact failure between electric contacts can be reduced.

Figure 4:
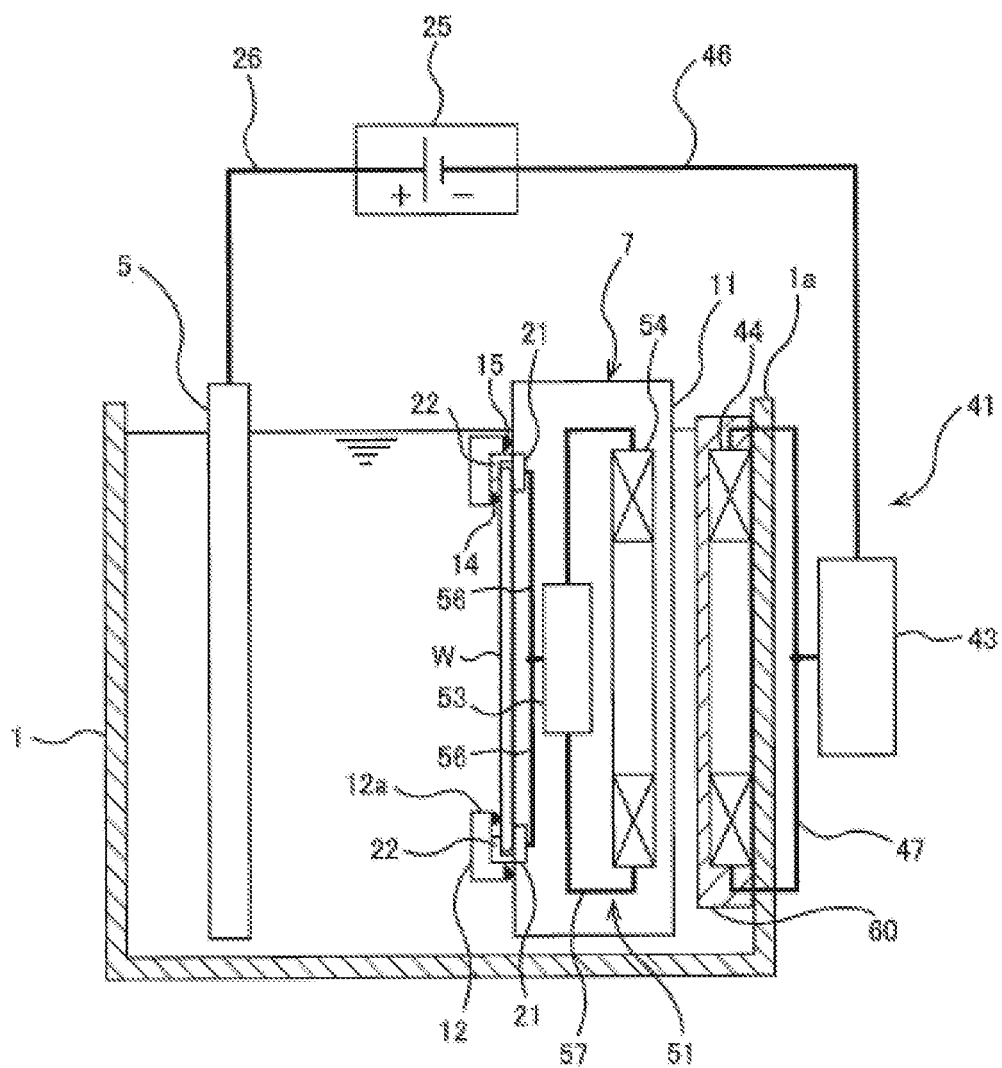
FIG. 4 is a schematic view showing an electrolytic plating apparatus according to an embodiment.

FIG. 4 is a schematic view showing an electrolytic plating apparatus according to an embodiment. Structural and operational details of the present embodiment, which will not be described in particular, are identical to those of the embodiment shown in FIG. 1, and hence their repetitive descriptions will be omitted. As shown in FIG. 4, the electric-power transmitting coil 44 of the wireless electric-power transmitter 41 is disposed in the plating tank 1. More specifically, the electric-power transmitting coil 44 is secured to an inner surface of the side wall 1a of the plating tank 1. The electric-power transmitting coil 44 is covered with a sealing cover 60 in a liquid-tight manner, so that the plating solution in the plating tank 1 will not come into contact with the electric-power transmitting coil 44. The sealing cover 60 may be constructed by a part of the side wall 1a of the plating tank 1.

As with the above embodiments, the DC-RF driver 43 is disposed outside the plating tank 1. The DC-RF driver 43 and the electric-power transmitting coil 44 are electrically connected to each other by wire 47. According to the present embodiment, the distance between the electric-power transmitting coil 44 and the electric-power receiving coil 54 can be short. As a result, the transmission efficiency is increased so that an effective voltage for plating of the substrate W can be reliably induced in the electric-power receiving coil 54.

Figure 5:
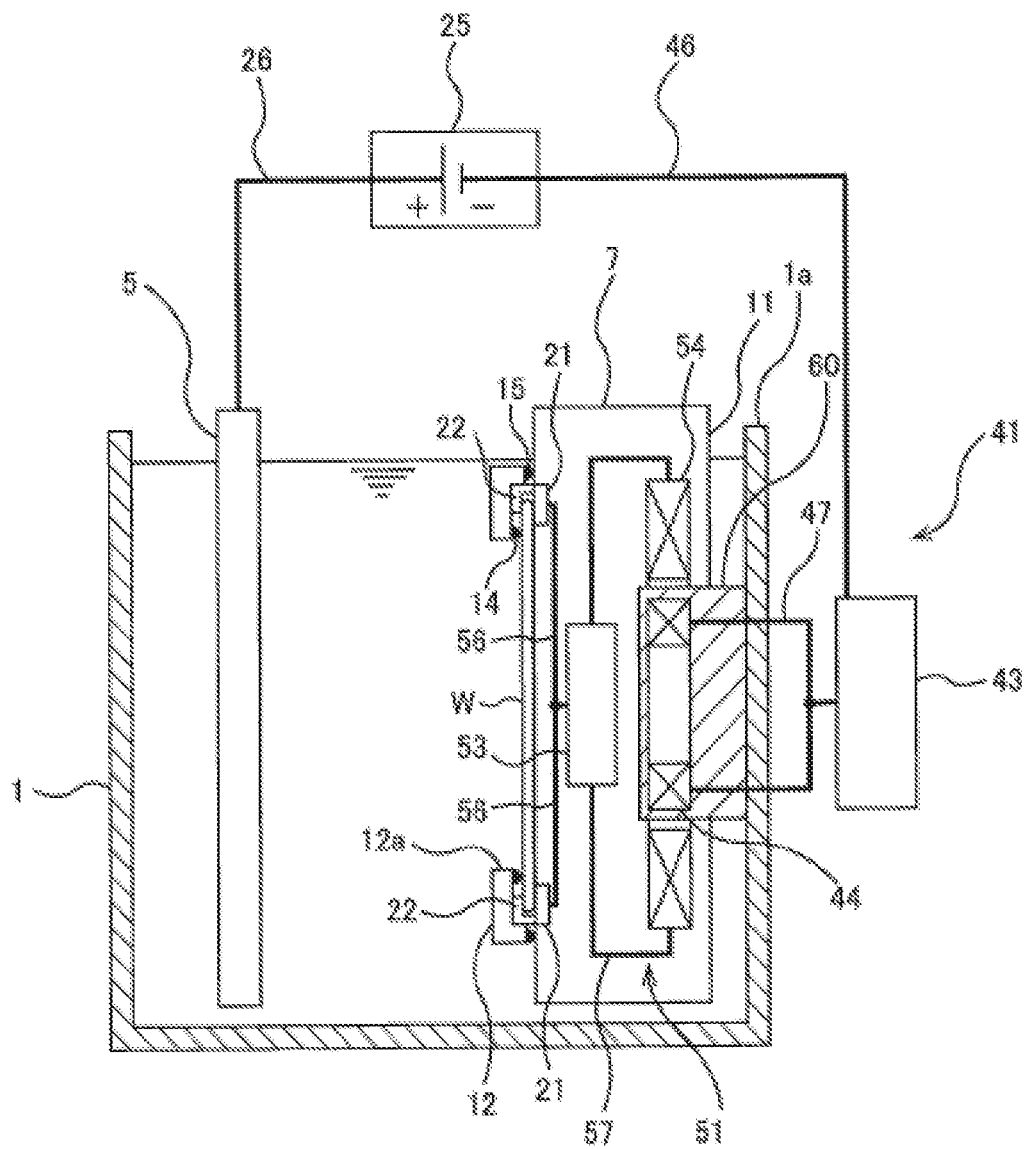
FIG. 5 is a schematic view showing an electrolytic plating apparatus according to an embodiment.

FIG. 5 is a schematic view showing an electrolytic plating apparatus according to an embodiment. Structural and operational details of the present embodiment, which will not be described in particular, are identical to those of the embodiment shown in FIG. 4, and hence their repetitive descriptions will be omitted. As shown in FIG. 5, the outside diameter of the electric-power transmitting coil 44 is smaller than the inside diameter of the electric-power receiving coil 54. The electric-power transmitting coil 44 is disposed radially inwardly of the electric-power receiving coil 54. In this embodiment, the electric-power transmitting coil 44 and the electric-power receiving coil 54 lie in the same plane and are arranged concentrically.

Figure 6:
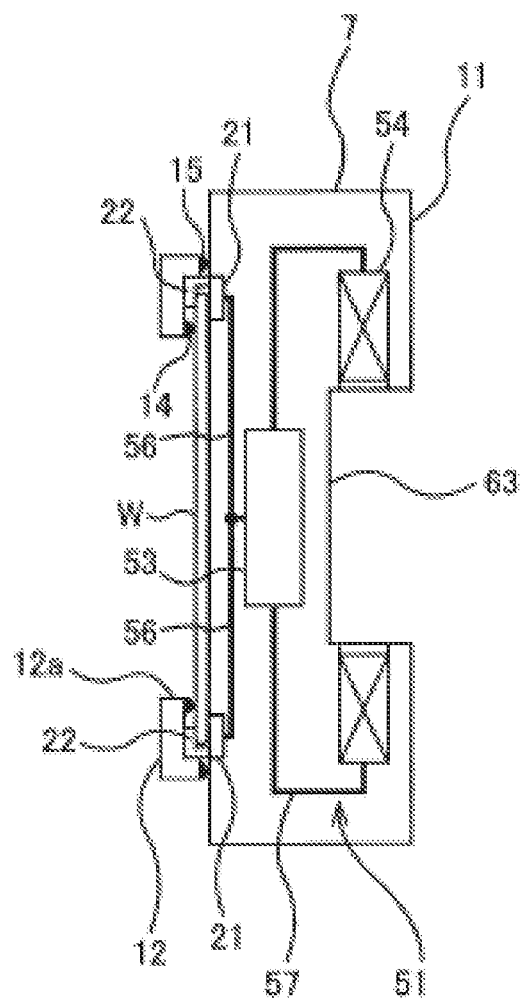
FIG. 6 is a cross-sectional view of a substrate holder shown in FIG. 5.
Figure 7:
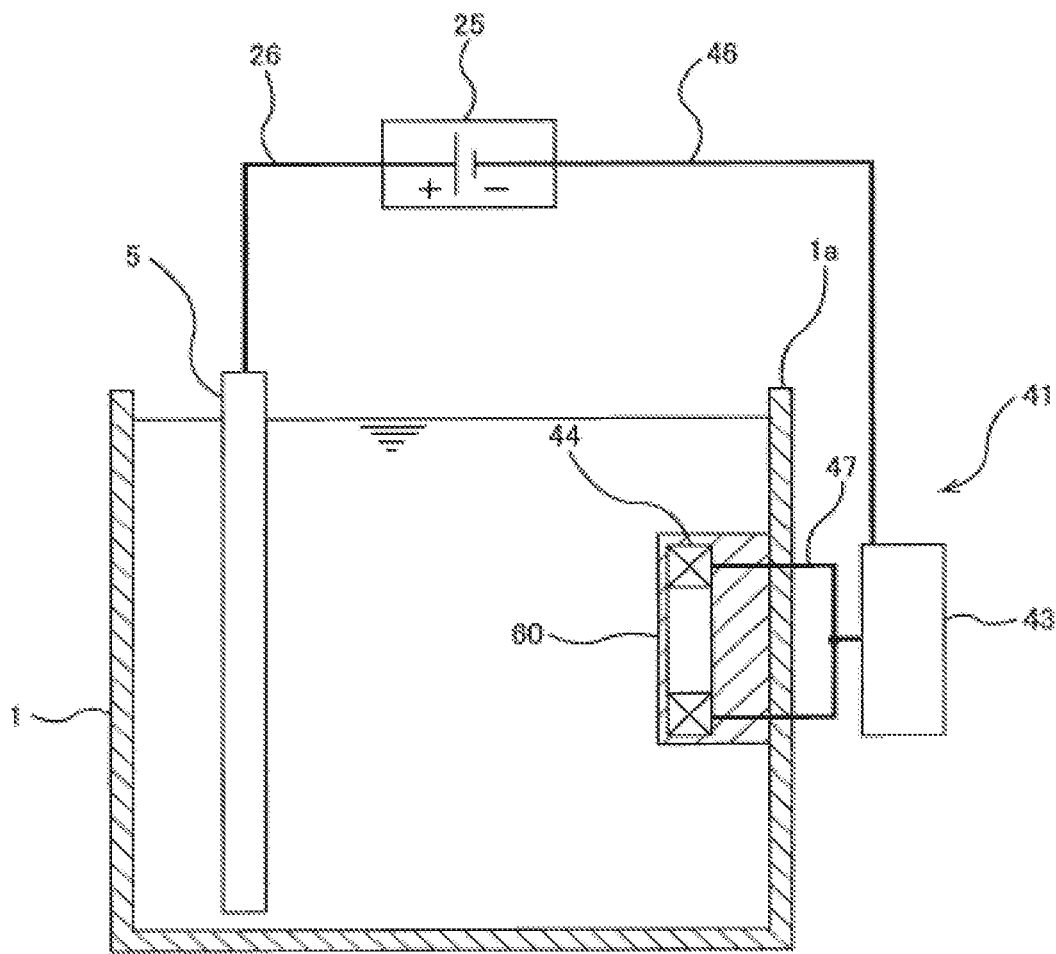
FIG. 7 is a cross-sectional view of a plating tank shown in FIG. 5.

FIG. 6 is a cross-sectional view of the substrate holder 7 shown in FIG. 5, and FIG. 7 is a cross-sectional view of the plating tank 1 shown in FIG. 5. The first holding member 11 of the substrate holder 7 has a recess 63 defined in a back surface of the first holding member 11. The recess 63 is located radially inwardly of the electric-power receiving coil 54. The size of the recess 63 is larger than the size of the sealing cover 60 shown in FIG. 7, so that the sealing cover 60 can be inserted into the recess 63. The sealing cover 60 has a shape fully covering the electric-power transmitting coil 44, which is disposed within the sealing cover 60. According to the present embodiment, the sealing cover 60 has a hollow cylindrical shape, and the outside diameter of the sealing cover 60 is smaller than the inside diameter of the electric-power receiving coil 54. FIG. 5 shows a state in which the electric-power transmitting coil 44 and the sealing cover 60 are located within the recess 63, i.e., a state in which the electric-power transmitting coil 44 is located inside the electric-power receiving coil 54.

The substrate holder 7 is set in the plating tank 1 as follows. The substrate holder 7 is transported to a position above the plating tank 1 by the transporter (not shown), and is then lowered into the plating tank 1. Then, the transporter moves the substrate holder 7 laterally toward the wireless electric-power transmitter 41 until the electric-power transmitting coil 44 and the sealing cover 60 are inserted into the recess 63 of the substrate holder 7. When the substrate holder 7 is to be removed from the plating tank 1, the transporter moves the substrate holder 7 laterally away from the wireless electric-power transmitter 41, and then draws the substrate holder 7 upwardly from the plating tank 1.

Figure 8:
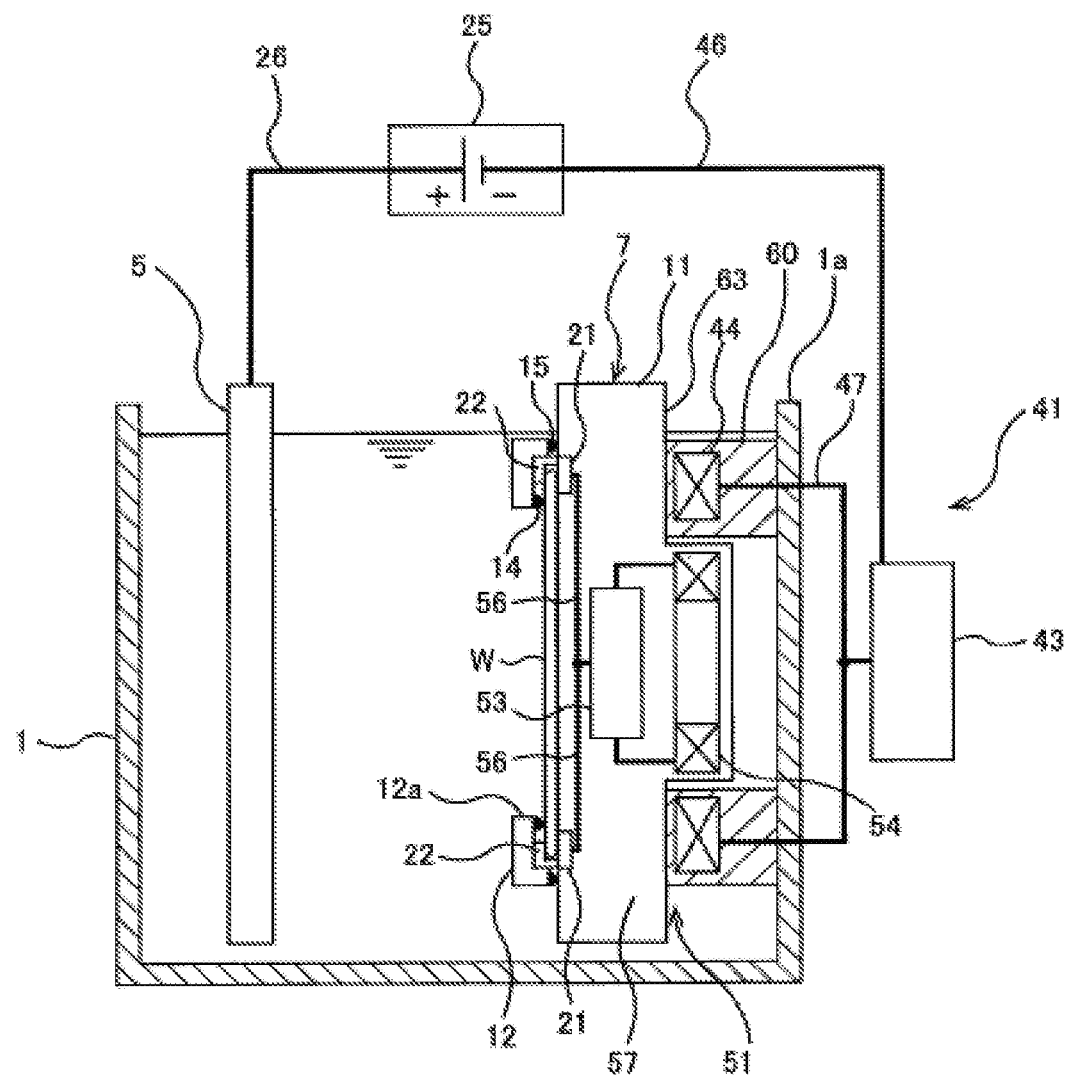
FIG. 8 is a schematic view showing an electrolytic plating apparatus according to an embodiment.

FIG. 8 is a schematic view showing an electrolytic plating apparatus according to an embodiment. Structural and operational details of the present embodiment, which will not be described in particular, are identical to those of the embodiment shown in FIG. 7, and hence their repetitive descriptions will be omitted. In this embodiment, as shown in FIG. 8, the inside diameter of the electric-power transmitting coil 44 is larger than the outside diameter of the electric-power receiving coil 54, and the electric-power transmitting coil 44 is located radially outwardly of the electric-power receiving coil 54. The first holding member 11 of the substrate holder 7 has an annular recess 63 defined in a back surface of the first holding member 11. The recess 63 is located radially outwardly of the electric-power receiving coil 54. The electric-power transmitting coil 44 and the sealing cover 60 are disposed in the recess 63. According to the present embodiment, the electric-power transmitting coil 44 and the electric-power receiving coil 54 lie in the same plane and are arranged concentrically.

According to the embodiments shown in FIGS. 4 through 8, since both the electric-power transmitting coil 44 and the electric-power receiving coil 54 are disposed in the plating tank 1, the distance between the electric-power transmitting coil 44 and the electric-power receiving coil 54 can be short. As a result, the transmission efficiency is increased so that an effective voltage for plating of the substrate W can be reliably induced in the electric-power receiving coil 54.

Figure 9:
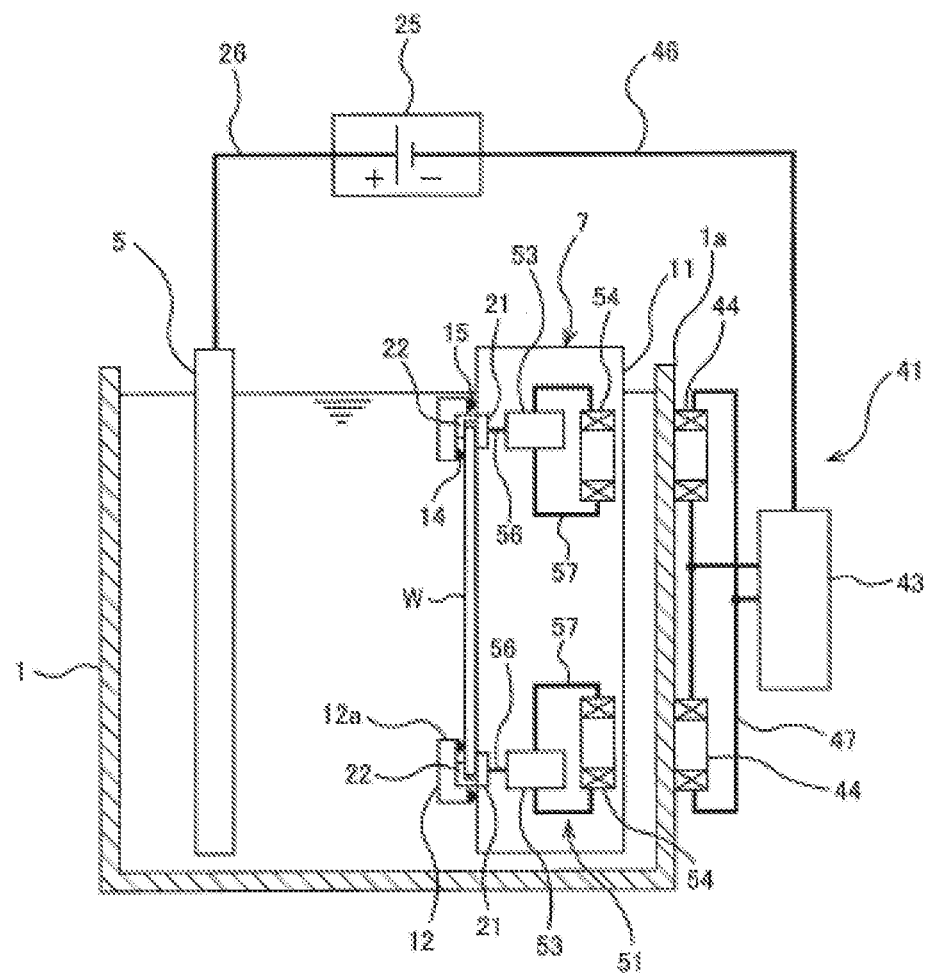
FIG. 9 is a schematic view showing an electrolytic plating apparatus according to an embodiment.
Figure 10:
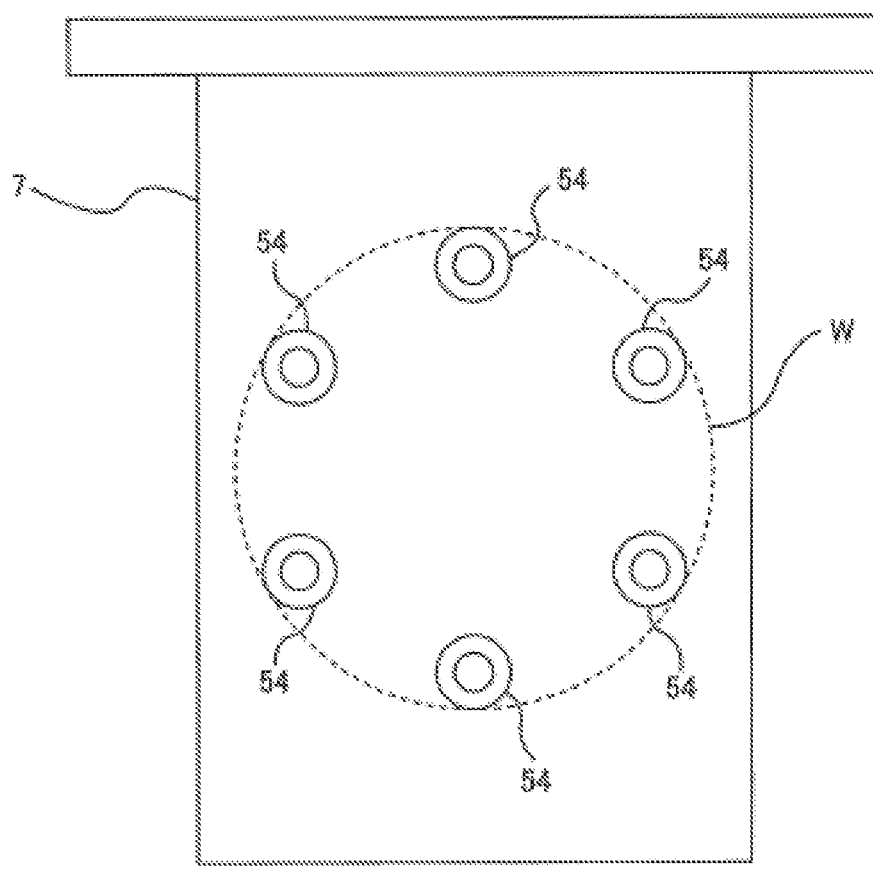
FIG. 10 is a view showing electric-power receiving coils disposed in a substrate holder.

FIG. 9 is a schematic view showing an electrolytic plating apparatus according to an embodiment, and FIG. 10 is a view showing electric-power receiving coils 54 disposed in a substrate holder 7. Structural and operational details of the present embodiment, which will not be described in particular, are identical to those of the embodiment shown in FIG. 1, and hence their repetitive descriptions will be omitted. According to the present embodiment, a plurality of electric-power transmitting coils 44 and a plurality of electric-power receiving coils 54 are provided. The number of electric-power transmitting coils 44 and the number of electric-power receiving coils 54 are the same. The electric-power transmitting coils 44 and the electric-power receiving coils 54 are spaced at equal intervals around a common central line (an imaginary line), and are opposite to each other.

The electrolytic plating apparatus has a single DC-RF driver 43, while a plurality of RF-DC rectifiers 53 are provided. The number of RF-DC rectifiers 53 is the same as the number of electric-power receiving coils 54. The number of electric-power transmitting coils 44, the number of electric-power receiving coils 54, and the number of RF-DC rectifiers 53 are the same as the number of first electric contacts 21 (or the number of second electric contacts 22). The electric-power receiving coils 54 and the RF-DC rectifiers 53 are disposed in the first holding member 11 of the substrate holder 7. In one embodiment, as with the embodiment shown in FIG. 3, the electric-power receiving coils 54 and the RF-DC rectifiers 53 may be disposed in the second holding member 12 of the substrate holder 7. The electric-power receiving coils 54 are coupled respectively to the RF-DC rectifiers 53 by a plurality of wires 57, and the RF-DC rectifiers 53 are coupled respectively to the first electric contacts 21 by a plurality of wires 56.

According to the present embodiment, electromagnetic fields are produced between the electric-power transmitting coils 44 and the corresponding electric-power receiving coils 54, thus inducing high-frequency voltages in the electric-power receiving coils 54. The RF-DC rectifiers 53 convert the high-frequency voltages generated by the electric-power receiving coils 54 into direct-current voltages, and apply the direct-current voltages to the first electric contacts 21 of the substrate holder 7. The first electric contacts 21 and the second electric contacts 22 are in contact with each other, and the second electric contacts 22 are in contact with the surface, to be plated, of the substrate W. Therefore, the direct-current voltages are applied to the substrate W.

According to the present embodiment, since the plural electric-power transmitting coils 44 and the plural electric-power receiving coils 54 are used, uniform values of currents supplied to the electric contacts 21, 22 can be achieved, thus making it possible to form a uniform film on the substrate W.

Figure 11:
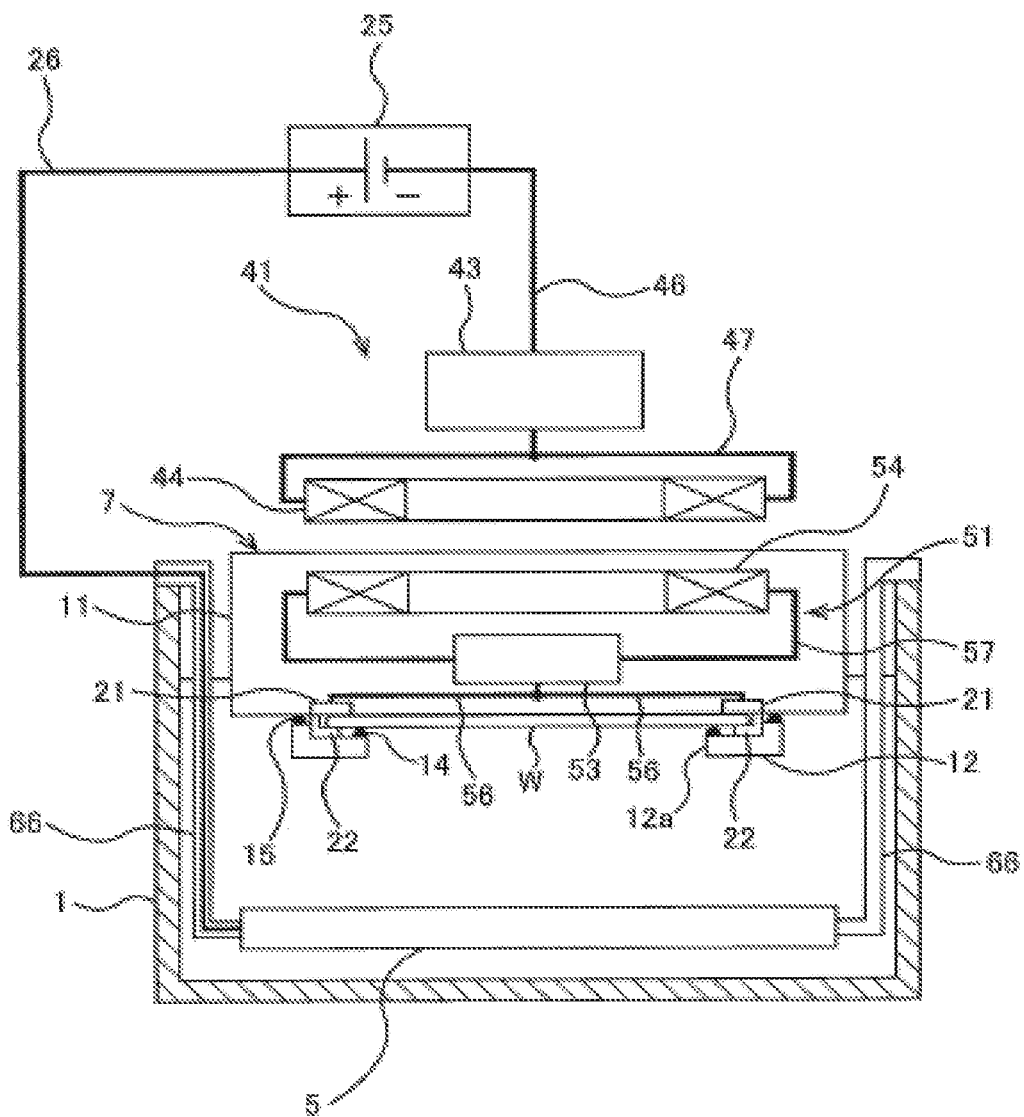
FIG. 11 is a schematic view showing an electrolytic plating apparatus according to an embodiment.

FIG. 11 is a schematic view showing an electrolytic plating apparatus according to an embodiment. Structural and operational details of the present embodiment, which will not be described in particular, are identical to those of the embodiment shown in FIG. 1, and hence their repetitive descriptions will be omitted. According to the present embodiment, the substrate holder 7 is disposed horizontally in the plating tank 1. The plating apparatus of this type is referred to as a face-down type wherein the surface, to be plated, of the substrate W faces downwardly. In the plating apparatus of the face-down type, the size of the second holding member 12 may be increased upwardly so as to dispense with the second seal ridge 15.

As shown in FIG. 11, anode 5 is disposed near the bottom of the plating tank 1. The anode 5, which is held by anode holders 66, is disposed horizontally in the plating tank 1. The anode holders 66 have their upper ends secured to the upper end of the plating tank 1, and have their lower ends coupled to the anode 5. The plural anode holders 66 are provided in the present embodiment, while only one anode holder 66 may be provided. The positive pole of the direct-current power supply 25 is electrically connected to the anode 5 by a wire 26 that extends through the anode holder 66.

According to the present embodiment, the electric-power transmitting coil 44 and the electric-power receiving coil 54 are disposed horizontally as well as the substrate W. The electric-power transmitting coil 44 and the electric-power receiving coil 54 are opposite to each other with a gap interposed therebetween. In this embodiment also, the electric-power transmitting coil 44 and the electric-power receiving coil 54 are arranged concentrically. The electric-power receiving coil 54 and the RF-DC rectifier 53 are disposed in the first holding member 11 of the substrate holder 7. In one embodiment, as with the embodiment shown in FIG. 3, the electric-power receiving coil 54 and the RF-DC rectifier 53 may be disposed in the second holding member 12 of the substrate holder 7.

The electric-power transmitting coil 44 is disposed right above the substrate holder 7 that is placed in the plating tank 1, and is supported by a moving mechanism which is not shown in the drawing. When the substrate holder 7 is to be set in the plating tank 1 and when the substrate holder 7 is to be removed from the plating tank 1, the electric-power transmitting coil 44 is moved away from the plating tank 1 by the aforementioned moving mechanism. When the substrate W is to be plated, the electric-power transmitting coil 44 is moved to a position above the substrate holder 7 by the aforementioned moving mechanism.

Figure 12:
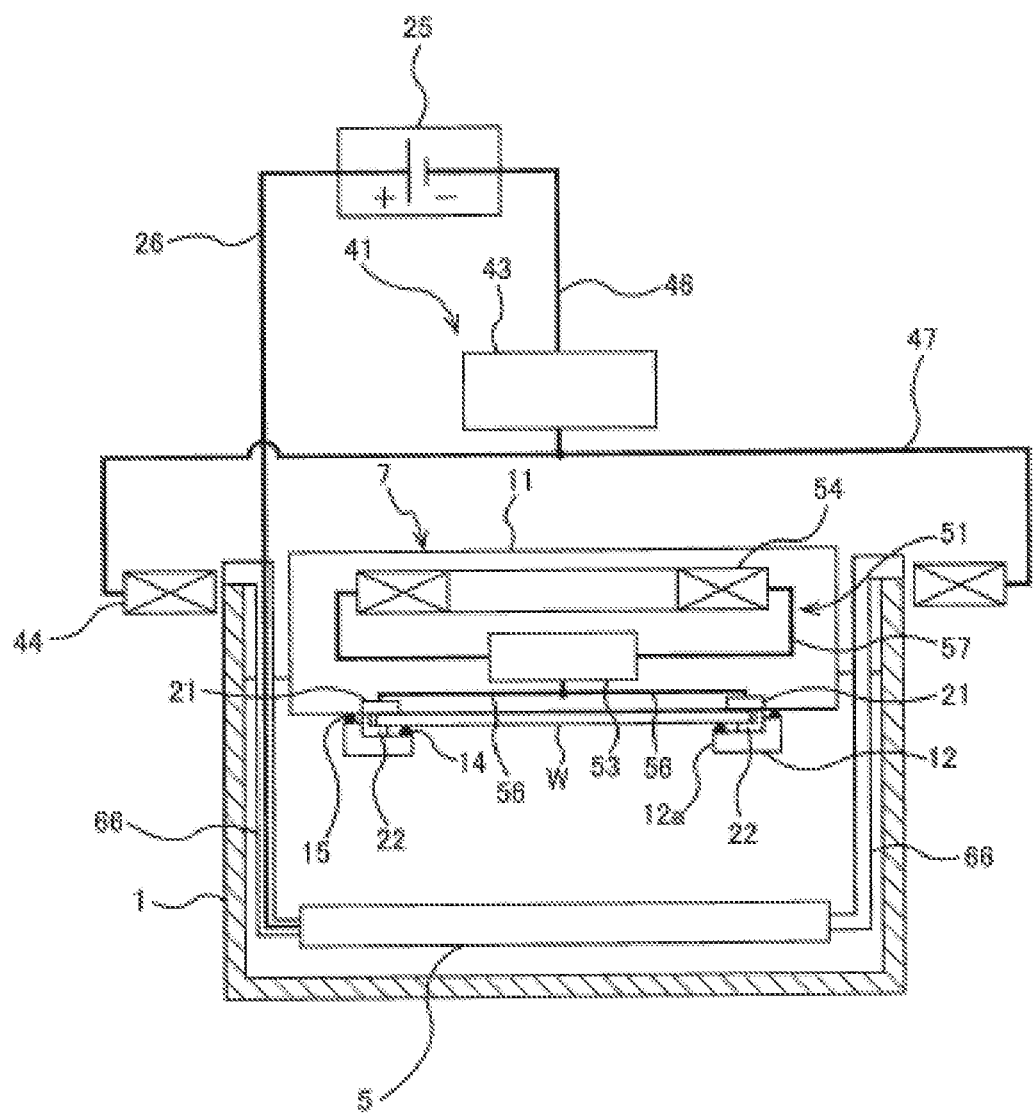
FIG. 12 is a schematic view showing an electrolytic plating apparatus according to an embodiment.

FIG. 12 is a schematic view showing an electrolytic plating apparatus according to an embodiment. Structural and operational details of the present embodiment, which will not be described in particular, are identical to those of the embodiment shown in FIG. 11, and hence their repetitive descriptions will be omitted. According to the present embodiment, the electric-power transmitting coil 44 is disposed around the plating tank 1. More specifically, the electric-power transmitting coil 44 is disposed around the substrate holder 7 that is placed in the plating tank 1. The electric-power transmitting coil 44 and the electric-power receiving coil 54 lie in the same plane, and are arranged concentrically. In this embodiment, it is not necessary to provide the above-described moving mechanism for moving the electric-power transmitting coil 44.

Figure 13:
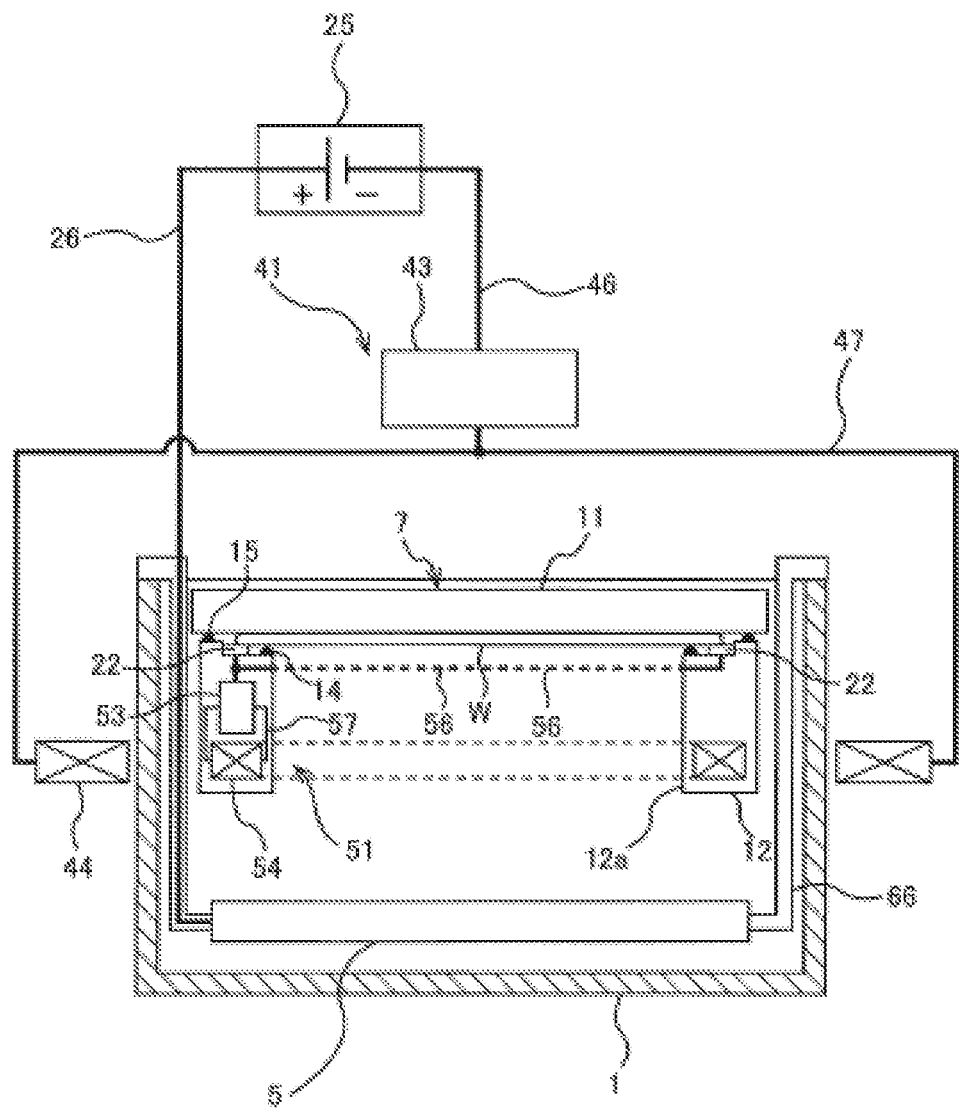
FIG. 13 is a schematic view showing an electrolytic plating apparatus according to an embodiment.

FIG. 13 is a schematic view showing an electrolytic plating apparatus according to an embodiment. Structural and operational details of the present embodiment, which will not be described in particular, are identical to those of the embodiment shown in FIG. 12, and hence their repetitive descriptions will be omitted. The present embodiment is the same as the embodiment shown in FIG. 12 in that the substrate holder 7 is disposed horizontally in the plating tank 7, but is different in that the wireless electric-power receiver 51 is disposed in the second holding member 12 of the substrate holder 7. The structures of the wireless electric-power receiver 51 and the substrate holder 7 are the same as those of the embodiment shown in FIG. 3. Specifically, the RF-DC rectifier 53 and the electric-power receiving coil 54 are disposed in the second holding member 12 of the substrate holder 7. According to the present embodiment, the first electric contacts 21 for electrically connecting the first holding member 11 and the second holding member 12 of the substrate holder 7 are not necessary.

Figure 14:
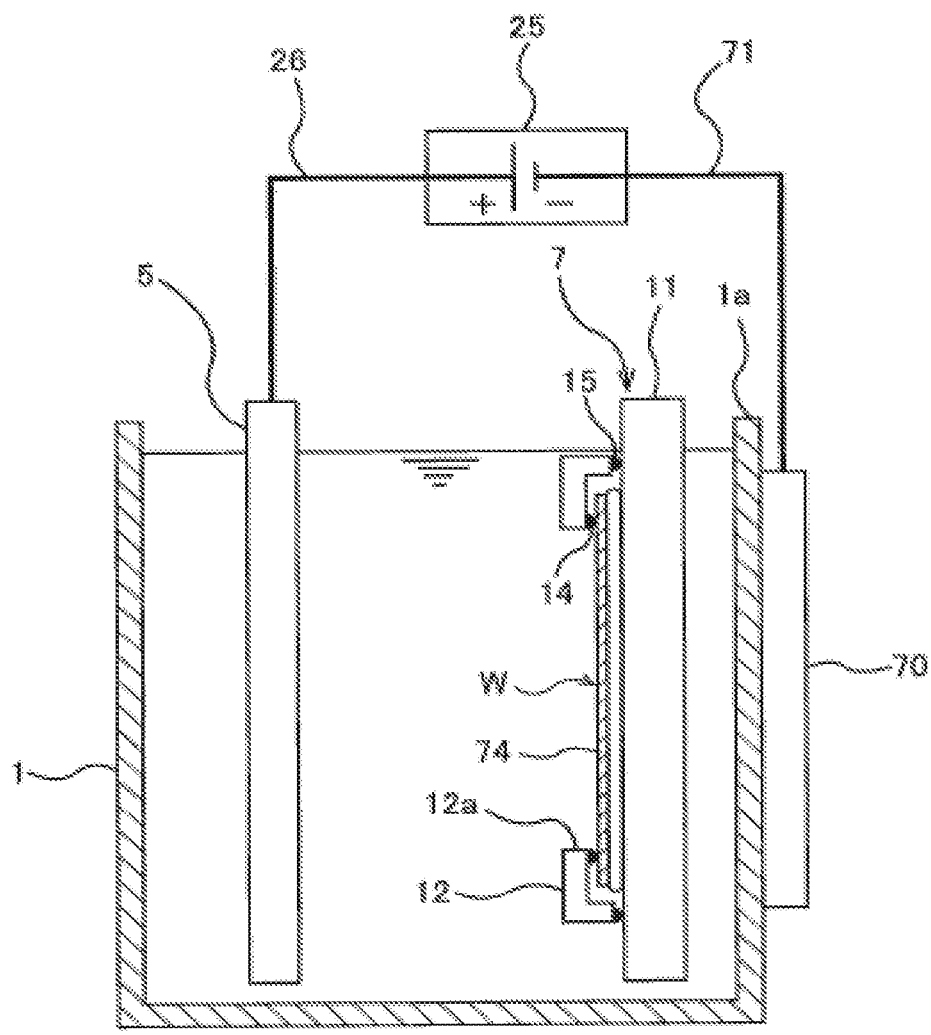
FIG. 14 is a schematic view showing an electrolytic plating apparatus according to an embodiment.

FIG. 14 is a schematic view showing an electrolytic plating apparatus according to an embodiment. Structural and operational details of the present embodiment, which will not be described in particular, are identical to those of the embodiment shown in FIG. 1, and hence their repetitive descriptions will be omitted. According to the present embodiment, a metal plate 70 is provided instead of the wireless electric-power transmitter 41 and the wireless electric-power receiver 51. The metal plate 70 is disposed outside the plating tank 1, and the substrate holder 7 and the substrate W are disposed between the anode 5 and the metal plate 70. According to the present embodiment, the metal plate 70 is secured to the outer surface of the side wall 1a of the plating tank 1. The metal plate 70 is electrically connected to the negative pole of the direct-current power supply 25 by a wire 71. The metal plate 70 is disposed in a vertical position, and has a size equal to or larger than the substrate W. The metal plate 70 may be made of copper, for example. The electrolytic plating apparatus according to the present embodiment does not include devices corresponding to the wireless electric-power transmitter 41 and the wireless electric-power receiver 51 in the above-described embodiments.

The surface, to be plated, of the substrate W comprises a conductive layer 74, such as a seed layer. When the direct-current power supply 25 applies a direct-current voltage to the anode 5 and the metal plate 70, the metal plate 70 and the conductive layer 74 function as a capacitor, thus inducing a direct-current voltage in the conductive layer 74. As a result, the direct-current power supply 25 and the substrate W are electrically connected to each other without physical contact. According to the present embodiment, it is not necessary to provide electric contacts in the substrate holder 7 for electrically connecting the substrate W and the direct-current power supply 25. According to the present embodiment, since any electric contacts that contact the substrate W are not necessary, the first seal ridge 14 and the second seal ridge 15 may not be provided. The present embodiment is applicable to PR plating in which a substrate is plated while the voltage of the direct-current power supply 25 is switched from positive to negative and vice versa.

Figure 15:
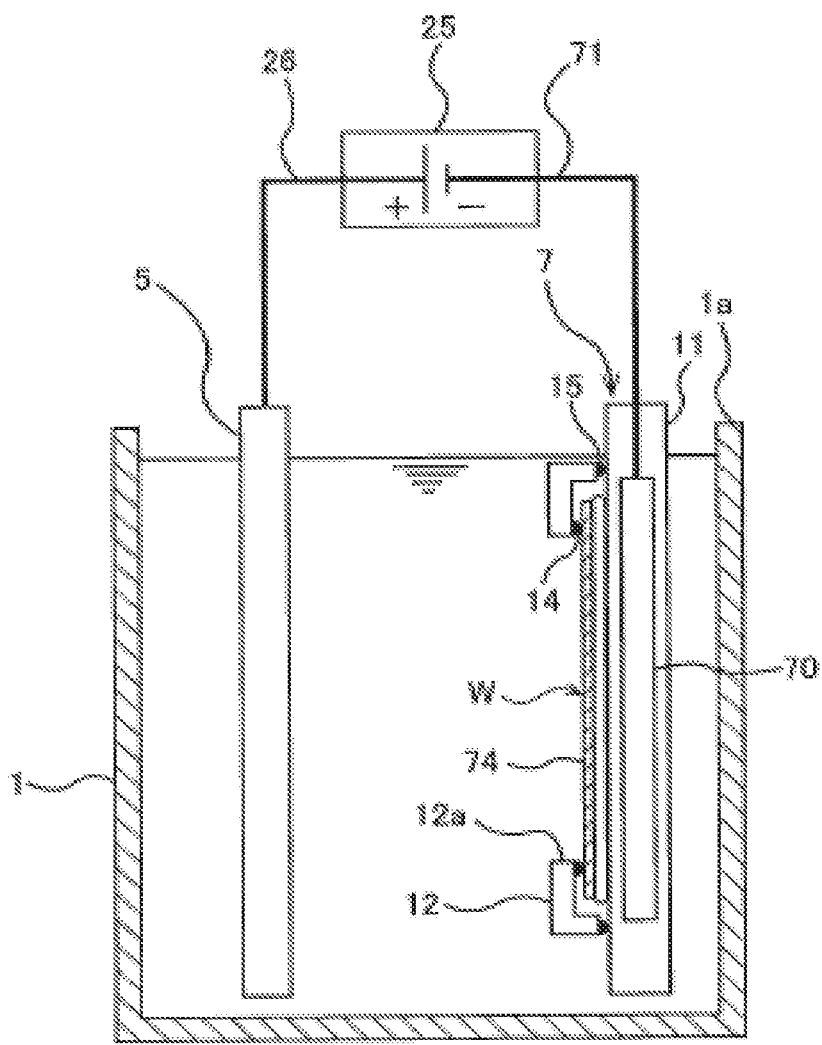
FIG. 15 is a schematic view showing an electrolytic plating apparatus according to an embodiment.

FIG. 15 is a schematic view showing an electrolytic plating apparatus according to an embodiment. Structural and operational details of the present embodiment, which will not be described in particular, are identical to those of the embodiment shown in FIG. 14, and hence their repetitive descriptions will be omitted. According to the present embodiment, a metal plate 70 is disposed in the substrate holder 7. More specifically, the metal plate 70 is disposed in the first holding member 11 of the substrate holder 7. The metal plate 70 is fully covered with the first holding member 11 in a liquid-tight manner. According to the present embodiment, since the direct-current power supply 25 and the substrate W can be electrically connected without physical contact, no electric contacts are necessary.

Figure 16:
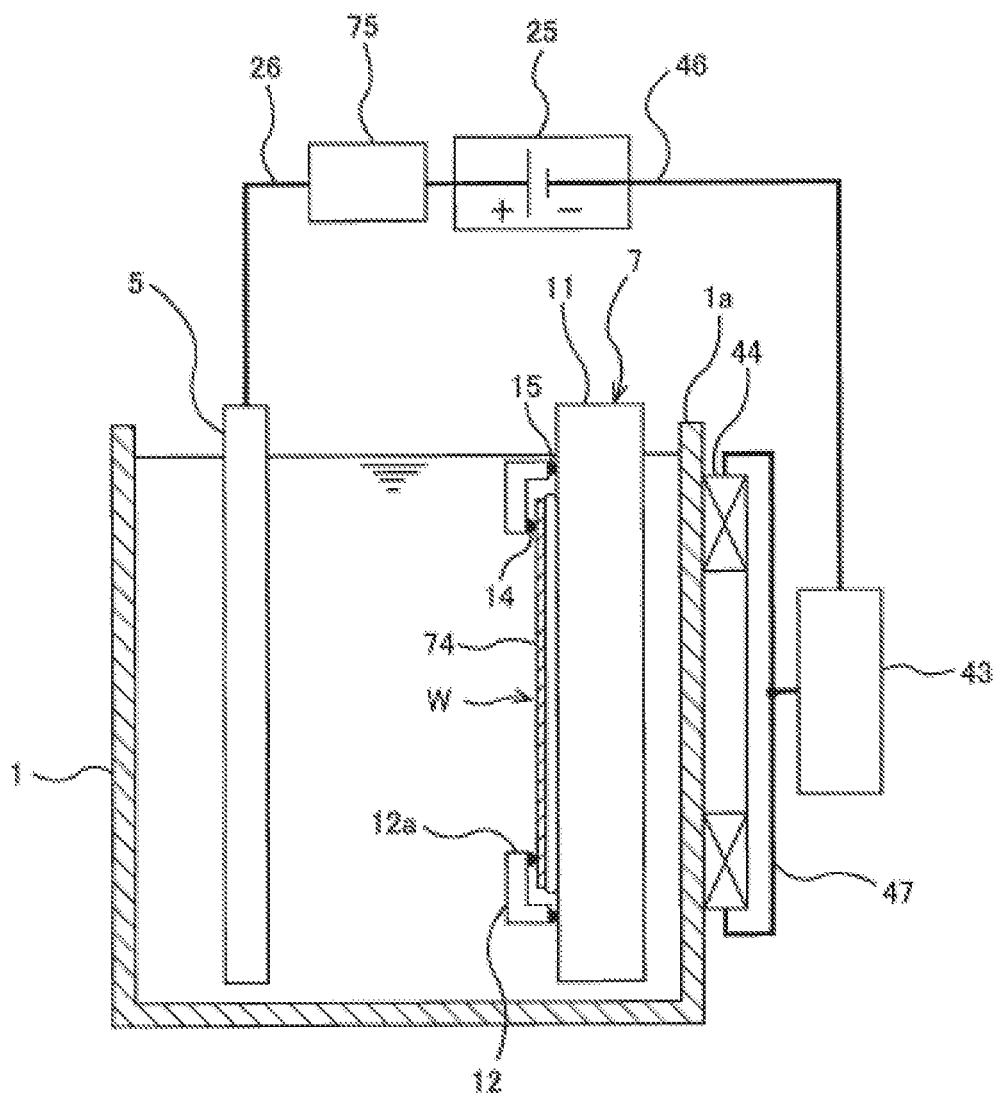
FIG. 16 is a schematic view showing an electrolytic plating apparatus according to an embodiment.

FIG. 16 is a schematic view showing an electrolytic plating apparatus according to an embodiment. Structural and operational details of the present embodiment, which will not be described in particular, are identical to those of the embodiment shown in FIG. 1, and hence their repetitive descriptions will be omitted. This embodiment is directed to a method of plating a substrate using a phenomenon in which a high-frequency eddy current is generated in a conductive material when a high-frequency current is passed to a coil at a cathode side. The DC-RF driver 43 and the electric-power transmitting coil 44 are disposed outside the plating tank 1, and the electric-power transmitting coil 44 is secured to the outer surface of the side wall 1a of the plating tank 1. The DC-RF driver 43 is electrically connected to the negative pole of the direct-current power supply 25 by wire 46, and further electrically connected to the electric-power transmitting coil 44 by wire 47. The positive pole of the direct-current power supply 25 is coupled to a DC-RF converter 75 by wire 26, and the DC-RF converter 75 is coupled to the anode 5 by wire 26. The DC-RF converter 75 is configured to convert a direct-current voltage, which is applied from the direct-current power supply 25, into a high-frequency voltage, and to apply the high-frequency voltage to the anode 5.

When the DC-RF driver 43 applies a high-frequency voltage to the electric-power transmitting coil 44, the electric-power transmitting coil 44 generates a high-frequency magnetic field, which generates an eddy current in the conductive layer 74, such as a seed layer, of the substrate W. The voltage generated in the conductive layer 74 by the eddy current can be changed by the output voltage of the direct-current power supply 25. According to the present embodiment, the electric contacts that contact the substrate W are not necessary. Therefore, the first seal ridge 14 and the second seal ridge 15 may not be provided.

Figure 17:
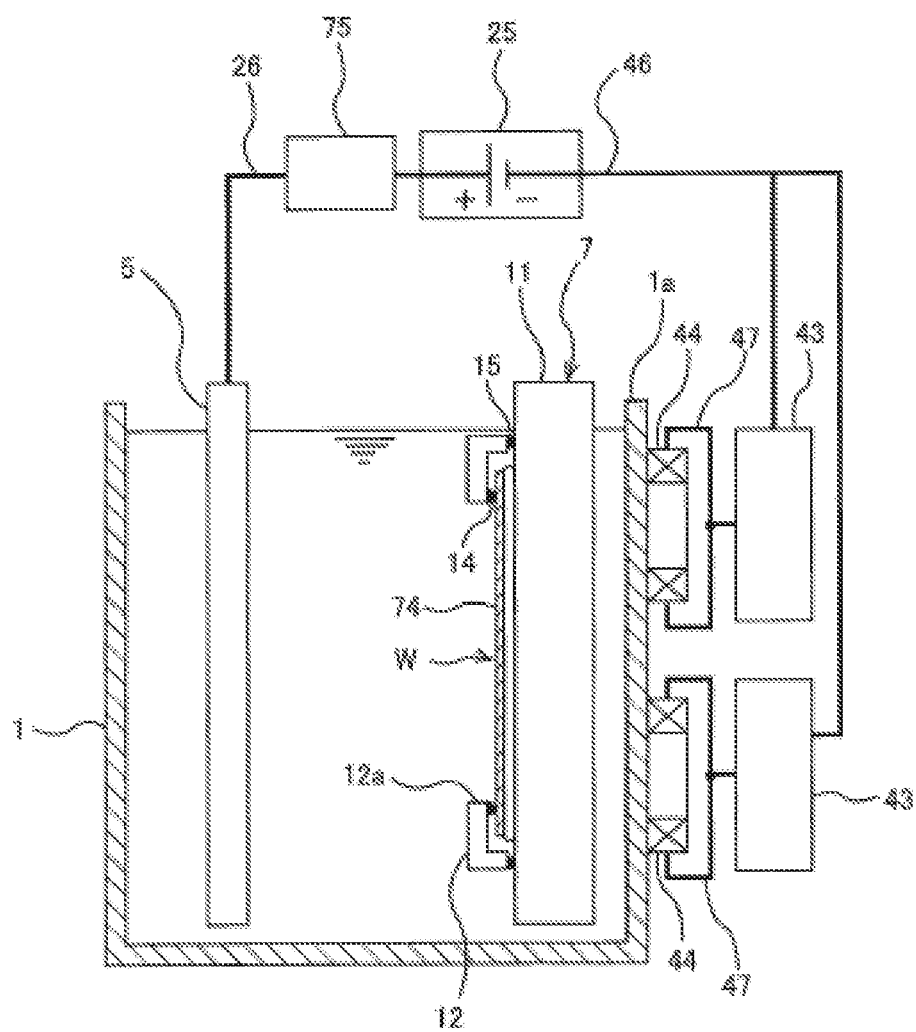
FIG. 17 is a schematic view showing an electrolytic plating apparatus according to an embodiment.

FIG. 17 is a schematic view showing an electrolytic plating apparatus according to an embodiment. Structural and operational details of the present embodiment, which will not be described in particular, are identical to those of the embodiment shown in FIG. 16, and hence their repetitive descriptions will be omitted. The electrolytic plating apparatus according to the present embodiment includes a plurality of DC-RF drivers 43 and a plurality of electric-power transmitting coils 44. The plurality of electric-power transmitting coils 44 are electrically connected to the plurality of DC-RF drivers 43 by wires 47, respectively. According to the present embodiment, when the DC-RF drivers 43 apply high-frequency voltages to the electric-power transmitting coils 44, these electric-power transmitting coils 44 generate high-frequency magnetic fields, which generate eddy currents in the conductive layer 74, such as a seed layer, of the substrate W. According to the present embodiment, therefore, no electric contacts that contact the substrate W are necessary.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. An electrolytic plating apparatus comprising:
   a plating tank configured to hold a plating solution therein;
   an anode disposed in the plating tank;
   a substrate holder having an electric contact arranged to be able to contact a substrate;
   a power supply coupled to the anode;
   a wireless electric-power transmitter coupled to the power supply;
   a wireless electric-power receiver mounted to the substrate holder and electrically connected to the electric contact;
   wherein the wireless electric-power transmitter includes at least one electric-power transmitting coil, and the wireless electric-power receiver includes at least one electric-power receiving coil.

2. The electrolytic plating apparatus according to claim 1, wherein the wireless electric-power transmitter is disposed outside the plating tank.

3. The electrolytic plating apparatus according to claim 1, wherein:
   the wireless electric-power transmitter comprises an electric-power transmitting coil; and
   the electric-power transmitting coil is disposed in the plating tank.

4. The electrolytic plating apparatus according to claim 3, wherein the substrate holder has a recess defined therein, and the electric-power transmitting coil is located in the recess.

5. The electrolytic plating apparatus according to claim 1, wherein:
   the substrate holder includes a first holding member and a second holding member for sandwiching the substrate therebetween;
   the second holding member has an opening through which a surface, to be plated, of the substrate can be exposed; and
   the wireless electric-power receiver is disposed in the second holding member.

6. The electrolytic plating apparatus according to claim 1, wherein the wireless electric-power transmitter includes a plurality of electric-power transmitting coils, and the wireless electric-power receiver includes a plurality of electric-power receiving coils.

7. The electrolytic plating apparatus according to claim 1, wherein the at least one electric-power transmitting coil and the at least one electric-power receiving coil are disposed in a vertical position.

8. The electrolytic plating apparatus according to claim 1, wherein the at least one electric-power transmitting coil and the at least one electric-power receiving coil are disposed in a horizontal position.

* * * * *